United States Patent
Chou et al.

(10) Patent No.: US 10,310,574 B1
(45) Date of Patent: Jun. 4, 2019

(54) ELECTRONIC APPARATUS WITH HEAT-DISSIPATION SYSTEM AND HEAT-DISSIPATION DEVICE THEREOF

(71) Applicant: Wistron Corp., New Taipei (TW)

(72) Inventors: Ying Tzu Chou, New Taipei (TW); Chien-Chung Chang, New Taipei (TW); Te-Lung Wu, New Taipei (TW)

(73) Assignee: WISTRON CORP., New Taipei (TW)

( * ) Notice: Subject to any disclaimer, the term of this patent is extended or adjusted under 35 U.S.C. 154(b) by 0 days.

(21) Appl. No.: 15/868,872

(22) Filed: Jan. 11, 2018

(30) Foreign Application Priority Data

Dec. 1, 2017 (TW) .............................. 106142133 A

(51) Int. Cl.
*G06F 1/20* (2006.01)
*H05K 7/20* (2006.01)
*F28F 3/02* (2006.01)

(52) U.S. Cl.
CPC ................ *G06F 1/206* (2013.01); *F28F 3/02* (2013.01); *H05K 7/2039* (2013.01); *H05K 7/20172* (2013.01); *H05K 7/20209* (2013.01); *H05K 7/20727* (2013.01); *H05K 7/20836* (2013.01)

(58) Field of Classification Search
CPC .................................. G06F 1/206; F28F 3/02
See application file for complete search history.

(56) References Cited

U.S. PATENT DOCUMENTS

| 9,377,828 | B2 | 6/2016 | Tunks et al. | |
| 2013/0242504 | A1* | 9/2013 | Cartes | G05D 23/1931 |
| | | | | 361/679.49 |

FOREIGN PATENT DOCUMENTS

| TW | I347511 | B | | 8/2011 | |
| TW | 201422120 | | * | 6/2014 | ................ F28F 3/06 |
| TW | I489933 | B | | 6/2015 | |
| TW | I547234 | B | | 8/2016 | |

\* cited by examiner

*Primary Examiner* — Mukundbhai G Patel

(57) ABSTRACT

An electronic apparatus with a heat-dissipation system includes a heat-dissipation device including a base, a heat-dissipation structure rotatably disposed on the bottom base, and a drive mechanism configured to selectively rotate the heat-dissipation structure toward one of a plurality of pre-determined orientations.

6 Claims, 10 Drawing Sheets

ELECTRONIC APPARATUS WITH HEAT-DISSIPATION SYSTEM AND HEAT-DISSIPATION DEVICE THEREOF

CROSS-REFERENCE TO RELATED APPLICATIONS

This Application claims priority of Taiwan Patent Application No. 106142133 filed on Dec. 1, 2017, the entirety of which is incorporated by reference herein.

BACKGROUND OF THE INVENTION

Field of the Invention

The present disclosure relates to an electronic apparatus, and in particular to an electronic apparatus with a heat-dissipation system.

Description of the Related Art

There are many high-efficiency processing chips disposed in computers for improving the efficiency of those computers, which may include servers. However, when processing chips are operated at full speed, the processing chips generate a lot of heat in the computer.

For dissipating the heat in the computer, the conventional heat-dissipation system used in computers includes heat-dissipation structures disposed on each of the processing chips, and many fans disposed in the computer so as to increase the amount of airflow flowing to the heat-dissipation structures.

However, when some of the fans stop working, the distribution of the airflow inside the computer changes, and thus the heat-dissipation efficiency of the heat-dissipation structures decreases. Moreover, if the temperature of the processing chips reaches a critical temperature, the temperature of the processing chips must be lowered by decreasing the operation speed of the processing chips. However, this also decreases the efficiency of the computer.

Although conventional heat-dissipation systems for computers have generally been adequate for their intended purposes, they have not been entirely satisfactory in all respects. Consequently, it is desirable to provide a solution for improving heat-dissipation systems.

BRIEF SUMMARY OF THE INVENTION

The disclosure provides an electronic apparatus with a heat-dissipation system. The efficiency of the heat-dissipation system can be improved by rotating heat-dissipation structures to various orientations. Moreover, the electronic apparatus can rotate the heat-dissipation structure according to the operation conditions of fans or heat sources, so as to prevent the electronic apparatus from overheating or decreasing the operation speed of heat sources.

The disclosure provides a heat-dissipation device configured to be disposed in an electronic apparatus. The heat-dissipation device includes a bottom base, a heat-dissipation structure and a driving mechanism. The heat-dissipation structure includes a heat-dissipation base rotatably disposed on the bottom base; and heat-dissipation fins disposed on the heat-dissipation base. The driving mechanism is configured to selectively rotate the heat-dissipation structure to one of predetermined orientations.

In some embodiments, the driving mechanism further includes a first connection element connected to the heat-dissipation structure; a first magnetic element disposed on the first connection element; and a first electromagnet adjacent to the first magnetic element, and configured to generate a first magnetic field. The heat-dissipation structure is rotated to one of the predetermined orientations by changing the intensity of the first magnetic field.

In some embodiments, the driving mechanism further includes a second connection element pivoted on the first connection element; a second magnetic element disposed on the second connection element; and a second electromagnet adjacent to the second magnetic element, and configured to generate a second magnetic field. The heat-dissipation structure is rotated to one of the predetermined orientations by changing strengths of the first magnetic field and the second magnetic field.

In some embodiments, the driving mechanism further includes a connection assembly connected to the heat-dissipation structure; and a motor connected to the connection assembly. The heat-dissipation structure is rotated to one of the predetermined orientations by the motor driving the connection assembly.

In some embodiments, the connection assembly includes a connection element disposed on the heat-dissipation structure; a rack pivoted on the connection element; and a gear engaged with the rack, and connected to the motor.

The disclosure provides an electronic apparatus with a heat-dissipation system including a housing, a heat-dissipation device, a fan, sensors and a processing device. The heat-dissipation device includes a bottom base located in the housing; a heat-dissipation structure rotatably disposed on the bottom base; and a driving mechanism configured to rotate the heat-dissipation structure. The fan is disposed in the housing, and configured to generate an airflow passing through the heat-dissipation structure; sensors disposed in the housing, and configured to generate a plurality of sensing signals; and a processing device selectively rotating the heat-dissipation structure to one of the predetermined orientations according to the sensing signals, so as to increase the intensity of the airflow passing through the heat-dissipation structure.

In some embodiments, at least one of the sensors is located between the heat-dissipation structure and the fan. In some embodiments, the heat-dissipation structure is located between the fan and the sensors.

In some embodiments, the electronic apparatus further includes heat sources disposed in the housing. The sensors are located between the heat sources and the heat-dissipation structure, and adjacent to the heat sources or integrated in the heat sources. The processing device is configured to selectively rotate the heat-dissipation structure to one of the predetermined orientations according to the sensing signals, so as to enhance the intensity of the airflow toward to one of the heat sources.

The disclosure provides an electronic apparatus with heat-dissipation system including a housing, a heat-dissipation device, fans, and a processing device. The heat-dissipation device includes a bottom base located in the housing; a heat-dissipation structure rotatably disposed on the bottom base; and a driving mechanism configured to rotate the heat-dissipation structure. The fans is disposed in the housing, and configured to generate an airflow passing through the heat-dissipation structure. The processing device is configured to detect an operation condition of the fans, and generating an operation signal. The processing device controls the driving mechanism to make the heat-dissipation structure rotate to a predetermined orientation according to the operation signal.

In conclusion, the electronic device of the disclosure improves the heat-dissipation efficiency of the heat-dissipation device by adjusting the orientation of the heat-dissipation structure. In some embodiments, when at least one of the fans is not working, the heat-dissipation system can provide good heat-dissipation efficiency, so as to prevent the electronic device from overheating and crashing. In some embodiments, the heat-dissipation system selectively increases the amount of the airflow flowing to some of the heat sources, so as to prevent from decreasing the efficiency of some heat sources due to overheating.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

Figure 1:
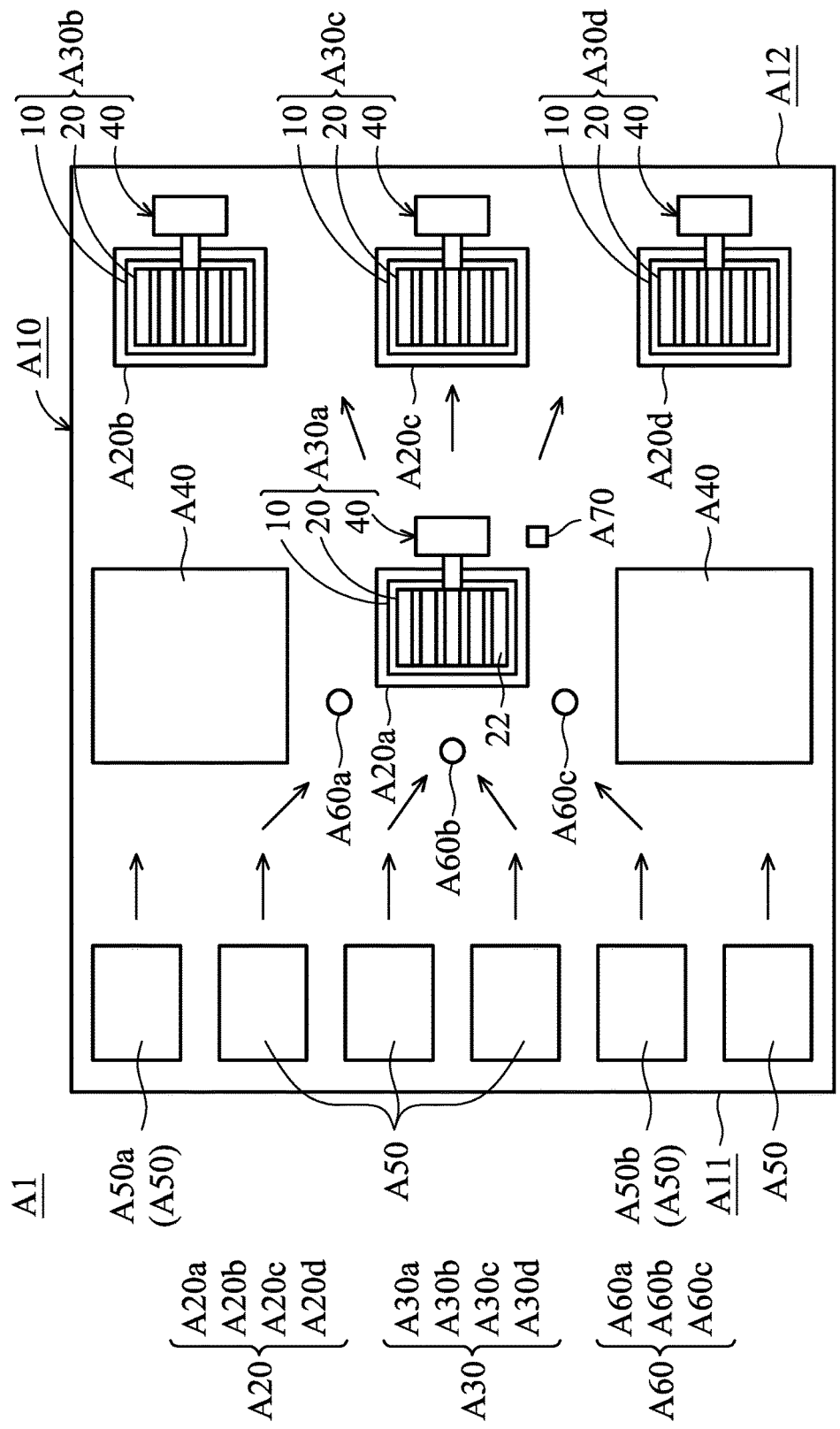
FIG. 1 is a schematic view of an electronic apparatus in accordance with a first embodiment of the disclosure, wherein the heat-dissipation structure is located at a first predetermined orientation.

The following disclosure provides many different embodiments, or examples, for implementing different features of the present disclosure. Specific examples of components and arrangements are described below to simplify the present disclosure. For example, the formation of a first feature over or on a second feature in the description that follows may include embodiments in which the first and second features are formed in direct contact, and may also include embodiments in which additional features may be formed between the first and second features, such that the first and second features may not be in direct contact.

The words, such as "first" or "second", in the specification are for the purpose of clarity of description only, and are not relative to the claims or meant to limit the scope of the claims. In addition, terms such as "first feature" and "second feature" do not indicate the same or different features.

Spatially relative terms, such as upper and lower, may be used herein for ease of description to describe one element or feature's relationship to other elements or features as illustrated in the figures. The spatially relative terms are intended to encompass different orientations of the device in use or operation in addition to the orientation depicted in the figures. Moreover, the shape, size, and thickness depicted in the drawings may not be drawn to scale or may be simplified for clarity of discussion; these drawings are merely intended for illustration.

FIG. 1 is a schematic view of an electronic apparatus A1 in accordance with a first embodiment of the disclosure, wherein the heat-dissipation structure 20 is located at a first predetermined orientation. The electronic apparatus A1 may be a computer host. In some embodiments, the electronic apparatus A1 may be a server. The electronic apparatus A1 includes a housing A10, heat sources A20 (such as the heat sources A20a to A20d), heat-dissipation devices A30 (such as heat-dissipation devices A30a to A30d), electronic devices A40, fans A50, sensors A60 (such as sensors A60a to A60c), and a processing device A70. The heat-dissipation devices A30, the fans A50, the sensors A60, and the processing device A70 are formed as a heat-dissipation system.

The heat sources A20 are disposed in the housing A10. When the electronic apparatus A1 is operated, the heat sources A20 generates heat. In some embodiments, the heat sources A20 may be chips, but there are not limited thereto. For example, the chips may be central processing chips, memories, or display chips. In the embodiment, there are four heat sources A20, but it is not limited thereto. Moreover, the position of the heat sources A20 distributed in the housing A10 can be changed according to the design requirements.

The heat-dissipation devices A30 are disposed in housing A10, and connected to the heat sources A20. In the embodiment, there are four heat-dissipation devices A30, but it is not limited thereto. The number of the heat-dissipation devices A30 may correspond to the number of the heat sources A20. In some embodiments, the number of the heat-dissipation devices A30 is less than the number of the heat sources A20. In some embodiments, the number of the heat-dissipation devices A30 is greater than the number of the heat sources A20.

Figure 7:
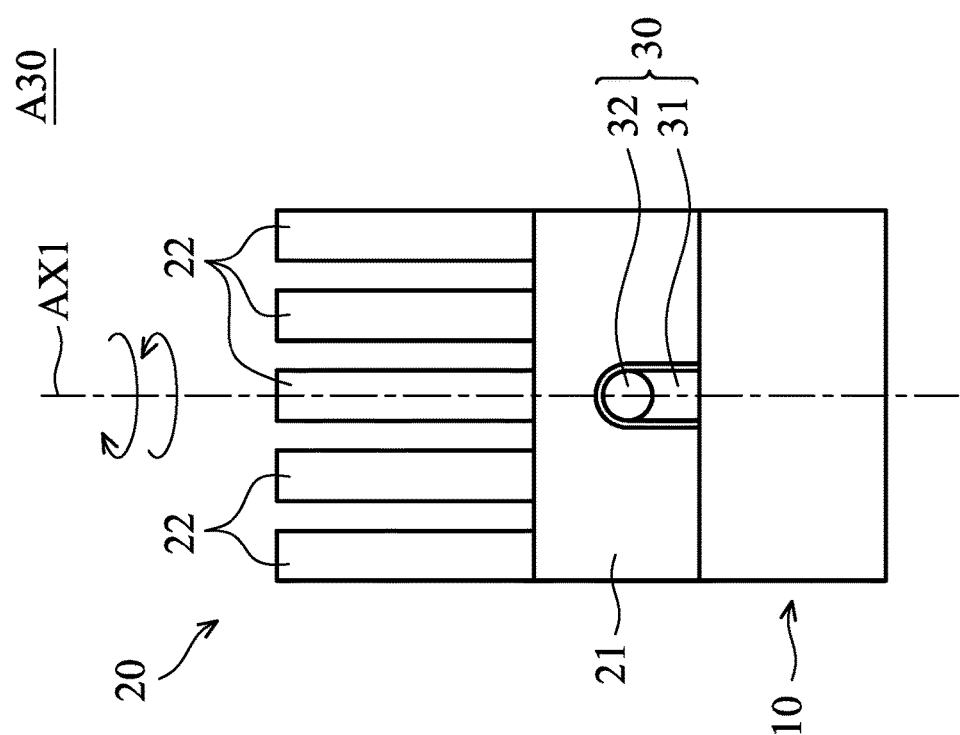
FIG. 7 is a cross-sectional view of the heat-dissipation devices in accordance with the first embodiment of the disclosure.

In the embodiment, each of the heat-dissipation devices A30 includes a bottom base 10, a heat-dissipation structure 20, a pivot structure 30 (as shown in FIG. 7), and a driving mechanisms 40. The bottom base 10 is disposed in the housing A10, and may be disposed on the heat source A20. The heat-dissipation structures 20 are rotatably disposed on the bottom bases 10 by the pivot structures 30. The driving mechanisms 40 are configured to rotate the heat-dissipation structures 20 relative to the bottom bases 10.

In some embodiments, some of the heat-dissipation devices A30 (such as the heat-dissipation devices A30b, A30c and A30d) may not include the bottom bases 10 and/or the driving mechanisms 40. When the heat-dissipation devices A30 do not include the bottom bases 10 and the driving mechanisms 40, the heat-dissipation structures 20 are detachably disposed on the heat sources A20, or the heat-dissipation structures 20 are connected to the heat sources A20 via heat-conducting elements (not shown in figures).

The electronic devices A40 are disposed in the housing A10. In the embodiment, there are two electronic devices A40, and disposed on two opposite sides of the heat-dissipation device A30a, but the position and number of the electronic devices A40 are not be limited thereto. For example, the electronic devices A40 are storage devices, such as hard disks or optical drives, but there are not limited thereto.

The fans A50 are disposed in the housing A10, and configured to generate an airflow. The airflow may pass through the heat-dissipation devices A30 and the heat-dissipation structures 20. In the embodiment, the fans A50 are configured to inhale the air outside of the housing A10 into the housing A10. In some embodiments, the fans A50 exhaust the air in the housing A10 to the outside of the housing A10.

In the embodiment, there are six fans A50, but it is not limited thereto. In some embodiments, there are one or at least one fans A50. In the embodiment, the fans A50 are arranged on the rear side A11 of the housing A10, but the arrangement of the fans A50 may be varied according to different designs.

Figure 2:
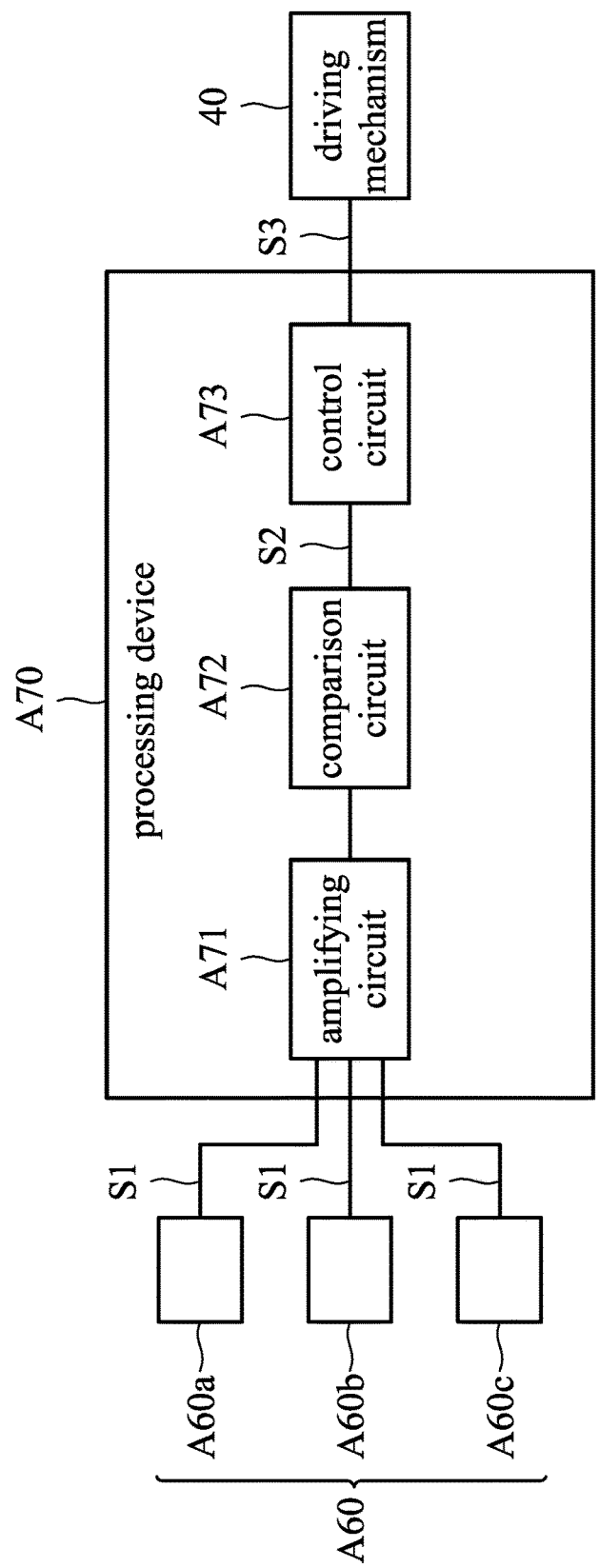
FIG. 2 is a system diagram of the processing device in accordance with the first embodiment of the disclosure.

The sensors A60 are disposed in the housing A10, and configured to generate sensing signals S1 (as shown in FIG. 2). In the embodiment, the sensors A60 are adjacent to the fans A50. The sensors A60 are disposed between the heat-dissipation structure 20 of the heat-dissipation device A30a and the fans A50.

In some embodiments, the sensors A60 are thermistors, and generate sensing signals S1 (as shown in FIG. 2) according to the changes of the resistances of the thermistors. In a case, the sensors A60 are thermistors. The intensity of the airflow flowing to the sensors A60 affects the resistances of the thermistors, and thus the amount of airflow passing through the sensors A60 can be inferred based on the resistances of the thermistors.

In some embodiments, the sensors A60 may be temperature sensors. Since the intensity of the airflow flowing to the sensors A60 affects the temperatures of the sensors A60, the amount of the airflow passing through the sensors A60 can be inferred based on the temperatures of the sensors A60.

FIG. 2 is a system diagram of the processing device A70 in accordance with the first embodiment of the disclosure. The processing device A70 is disposed in the housing A10, and connected to the sensors A60 and the driving mechanisms 40. The processing device A70 can selectively rotate the heat-dissipation structures 20 to many predetermined orientations according to the sensing signals S1, so as to change the movement direction of the airflow, and to enhance the intensity of the airflow passing through the heat-dissipation structures 20. Moreover, the driving mechanisms 40 can maintain the position of the heat-dissipation structures 20 on one of the predetermined orientations.

The processing device A70 is configured to receive the sensing signals S1, and generate a control signal S3 according to the sensing signals S1. In the embodiment, the processing device A70 may include an amplifying circuit A71, a comparison circuit A72, and a control circuit A73. The amplifying circuit A71 is configured to amplify the sensing signals S1, and transmit the amplified sensing signals S1 to the comparison circuit A72. The comparison circuit A72 is configured to generate a comparison signal S2 according to the sensing signals S1. The control circuit A73 generates a control signal S3 according to the comparison signal S2.

In the embodiment, the heat source A20a may be a central processing chip. The processing device A70 may be integrated in the central processing chip.

As shown in FIGS. 1 and 2, in some embodiments, when all of the fans A50 are working normally, the airflow are uniformly flowing to each of the sensors A60. Therefore, the sensors A60 (such as the sensors A60a, A60b and A60c) generate the same or substantially the same sensing signals S1. After the comparison circuit A72 processes the sensing signals S1, the comparison circuit A72 generates a comparison signal S2 having a first comparison value.

The control circuit A73 generates a first control signal S3 according to the first comparison value, so as to control the driving mechanisms 40 to rotate the heat-dissipation structure 20 of the heat-dissipation device A30a to a first predetermined orientation as shown in FIG. 1. Moreover, the driving mechanism 40 can maintain the heat-dissipation structure 20 of the heat-dissipation device A30a on the first predetermined orientation. When all of the fans A50 are working normally, the intensity of the airflow passing through the heat-dissipation structure 20 at the first predetermined orientation is greater. Therefore, the heat-dissipation efficiency of the heat-dissipation device A30a is improved.

In the embodiment, the heat-dissipation structure 20 includes heat-dissipation fins 22 parallel to and separated from each other. When all of the fans A50 are working normally, the extension direction of the heat-dissipation fins 22 at the first predetermined orientation is substantially parallel to the direction of the airflow flowing to the heat-dissipation structure 20. Therefore, the airflow can smoothly pass through the gaps between the heat-dissipation fins 22.

Figure 3:
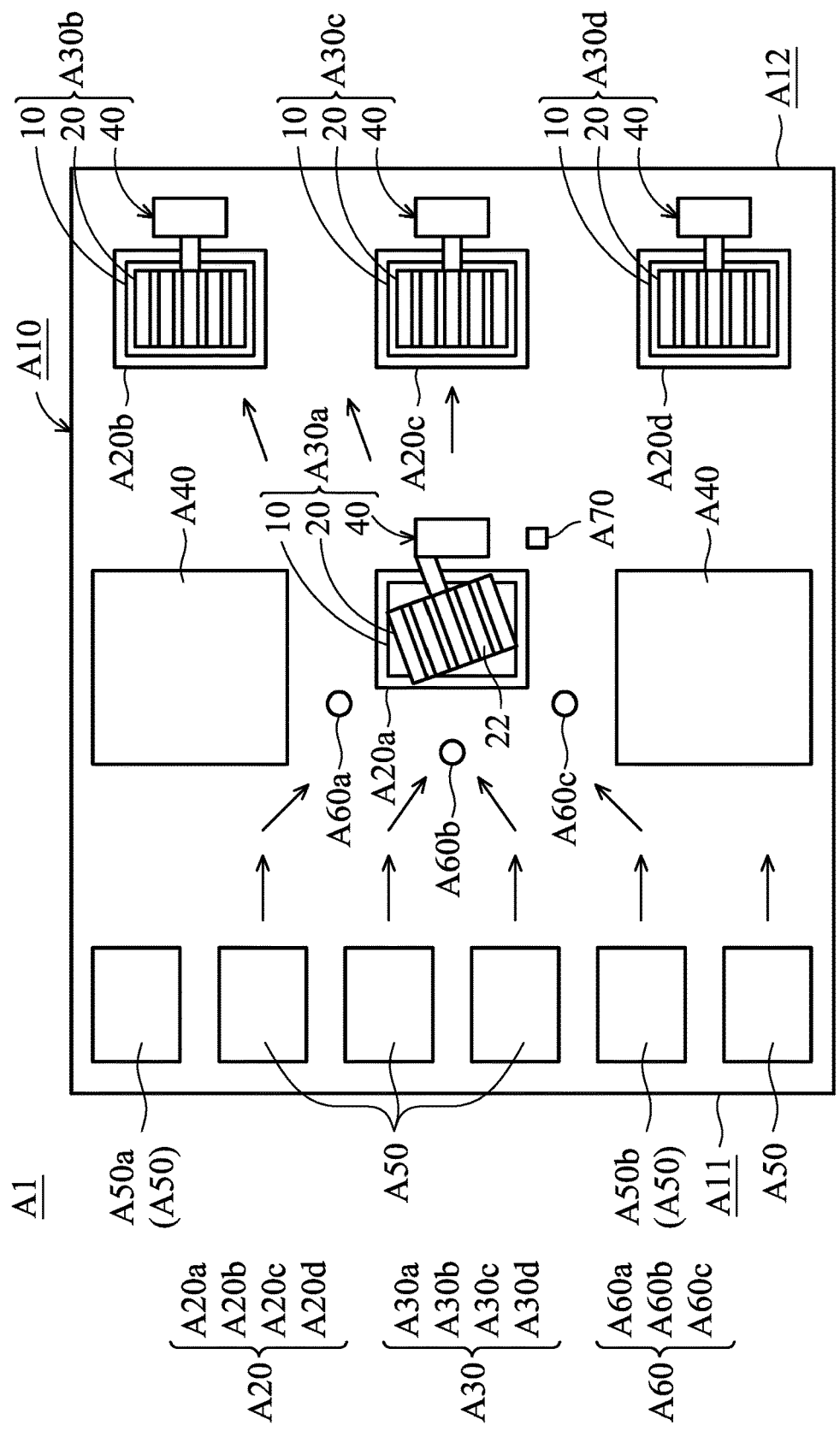
FIG. 3 is a schematic view of the electronic apparatus in accordance with the first embodiment of the disclosure, wherein the heat-dissipation structure of the heat-dissipation device is located at a second predetermined orientation.

FIG. 3 is a schematic view of the electronic apparatus A1 in accordance with the first embodiment of the disclosure, wherein the heat-dissipation structure 20 of the heat-dissipation device A30a is located at a second predetermined orientation. Moreover, the driving mechanism 40 can maintain the heat-dissipation structure 20 of the heat-dissipation device A30a on the second predetermined orientation. In some embodiments, when the fan A50a is not working, the distribution of the airflow generated by the fans A50 changes. The intensity of the airflow flowing to the sensor A60a is less than the intensity of the airflow flowing to the sensor A60b and A60c.

In one embodiment, the value of the sensing signal S1 generated by the sensor A60a is less than the value of the sensing signals S1 generated by the sensor A60b and A60c. Therefore, after the comparison circuit A72 processes the sensing signals S1, the comparison circuit A72 generates a comparison signal S2 having a second comparison value. The control circuit A73 generates a control signal S3 according to the second comparison value, so as to control the driving mechanism 40 to rotate the heat-dissipation device A30a of the heat-dissipation structure 20 to a second predetermined orientation as shown in FIG. 3.

Therefore, when the fan A50a is not working, the intensity of the airflow passing through the heat-dissipation structure 20 at the second predetermined orientation is greater than the intensity of the airflow passing through the heat-dissipation structure 20 at the first predetermined orientation. Therefore, the heat-dissipation efficiency of the heat-dissipation device A30a is improved. Moreover, when the fan A50a is not working, the extension direction of the heat-dissipation fins 22 at the second predetermined orientation is substantially parallel to the direction of the airflow flowing to the heat-dissipation structure 20. Therefore, the airflow can smoothly pass through the gaps between heat-dissipation fins 22 at the second predetermined orientation.

The embodiment is not limited to the situation of the fan A50a, which is not working. The processing device A70 controls the driving mechanism 40 to rotate the heat-dissipation structure 20 to various predetermined orientation according to the position and number of inoperable fans A50.

For example, when the fan A50b is not working, and the other fans A50 are working normally, the processing device A70 controls the driving mechanism 40 to rotate the heat-dissipation structure 20 of the heat-dissipation device A30a to a third predetermined orientation according to the sensing signals S1. Moreover, the driving mechanism 40 can maintain the heat-dissipation structure 20 of the heat-dissipation device A30a at the third predetermined orientation. When the fan A50a and the fan A50b are not working, and the other fans A50 are working normally, the processing device A70 controls the driving mechanism 40 to rotate the heat-dissipation structure 20 of the heat-dissipation device A30a to a fourth predetermined orientation according to the sensing signals S1. Moreover, the driving mechanism 40 can maintain the heat-dissipation structure 20 of the heat-dissipation device A30a at the fourth predetermined orientation.

In some embodiments, the processing device A70 can rotate the heat-dissipation structures 20 of the heat-dissipation devices A30b, A30c and A30d by the disclosed methods, so as to improve the heat-dissipation efficiency of the heat-dissipation devices A30b, A30c and A30d.

Accordingly, in the embodiment, the heat-dissipation system can adjust the orientations of the heat-dissipation structures 20 according to the operation conditions of the fans A50, so as to improve the heat-dissipation efficiency of the heat-dissipation devices A30. Moreover, when some of the fans A50 are not working, the heat-dissipation system also provides great heat-dissipation efficiency, so as to prevent the electronic apparatus A1 from overheating and crashing.

In some embodiments, the electronic apparatus A1 may not include the sensors A60, and the processing device A70 is directly electrically connected to each of the fans A50. Therefore, the processing device A70 can detect the operation conditions of the fans A50, and generate an operation signal. Afterwards, the processing device A70 controls the driving mechanisms 40 to rotate the heat-dissipation structures 20 to various predetermined orientations according to the operation signal, so as to change the flowing direction of the airflow.

For example, when all of the fans A50 are working normally, the processing device A70 controls the driving mechanism 40 to rotate the heat-dissipation structure 20 to the first predetermined orientation according to the operation signal. Alternately, when the fan A50a is not working, the processing device A70 controls the driving mechanism 40 to rotate the heat-dissipation structure 20 to the second predetermined orientation according to the operation signal. When the fan A50b is not working, the processing device A70 controls the driving mechanism 40 to rotate the heat-dissipation structure 20 to the third predetermined orientation according to the operation signal.

Figure 4:
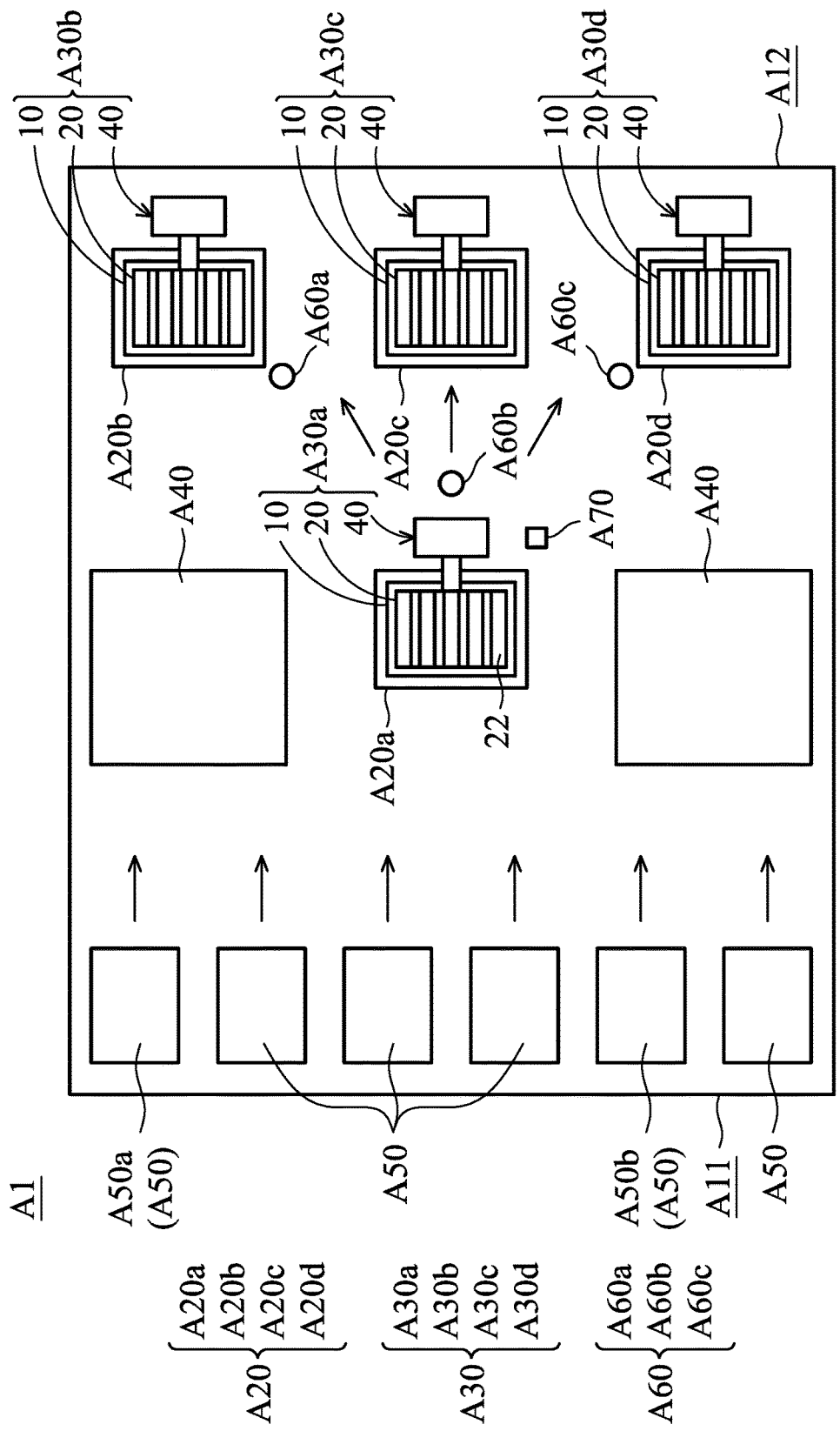
FIG. 4 is a schematic view of an electronic apparatus in accordance with a second embodiment of the disclosure, wherein the heat-dissipation structure is located at a first predetermined orientation.
Figure 5:
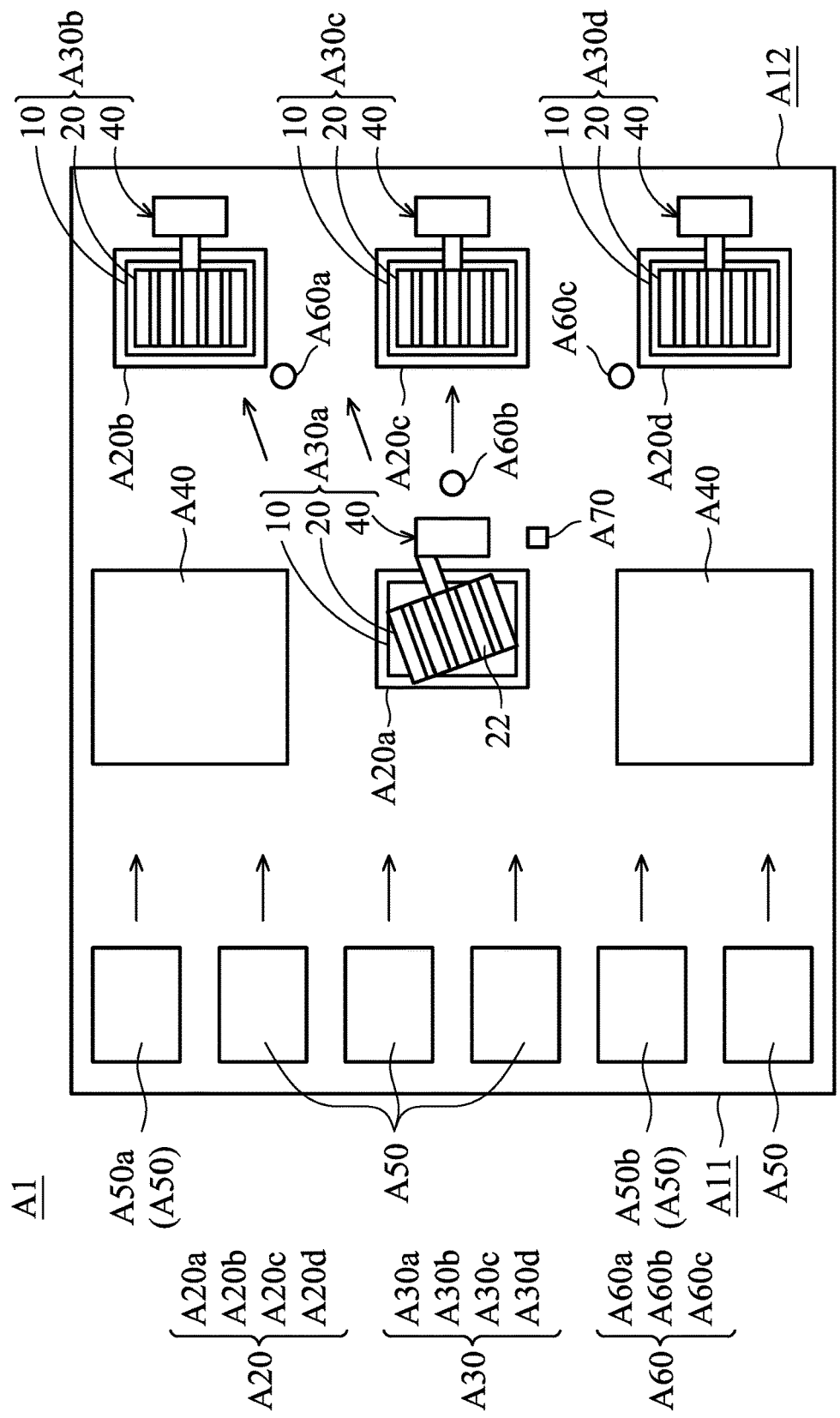
FIG. 5 is a schematic view of an electronic apparatus in accordance with the second embodiment of the disclosure, wherein the heat-dissipation structure is located at a second predetermined orientation.

FIG. 4 is a schematic view of an electronic apparatus A1 in accordance with a second embodiment of the disclosure, wherein the heat-dissipation structure 20 is located at a first predetermined orientation. FIG. 5 is a schematic view of an electronic apparatus A1 in accordance with the second embodiment of the disclosure, wherein the heat-dissipation structure 20 is located at a second predetermined orientation. The processing device A70 selectively rotates the heat-dissipation structure 20 to various predetermined orientations according to the sensing signals S1, so as to enhance the intensity of the airflow flowing to one of the heat sources A20.

In the embodiment, the sensors A60 according to the front side A12 of the housing A10, and adjacent to the heat sources A20b, A20c and A20d and the heat-dissipation devices A30b, A30c and A30d. In some embodiments, the sensors A60 are disposed on the heat-dissipation devices A30b, A30c and A30d. In some embodiments, the sensors A60 may be disposed between the heat-dissipation devices A30b, A30c and A30d and the heat-dissipation structure 20 of the heat-dissipation device A30a. Moreover, the heat-dissipation structure 20 of the heat-dissipation device A30a may be disposed between the fans A50 and the sensors A60. In some embodiments, the sensors A60 are integrated in the heat sources A20b, A20c and A20d.

In the embodiment, the heat source A20a may be a central processing chip. The processing device A70 may be integrated in the central processing chip.

In the embodiment, the sensors A60 may be temperature sensors. In some embodiments, when the sensing signal S1 of the sensor A60b has a greater value, it means that the heat source A20c has greater temperature. The processing device A70 can control the driving mechanism 40 to rotate the heat-dissipation structure 20 of the heat-dissipation device A30a to the first predetermined orientation as shown in FIG. 4 according to the sensing signals S1, so as to enhance the intensity of the airflow flowing to the heat source A20c.

In some embodiments, when the sensing signal S1 of the sensor A60a has greater value, it means the heat source A20b has a greater temperature. The processing device A70 controls the driving mechanism 40 to rotate the heat-dissipation structure 20 of the heat-dissipation device A30a to the second predetermined orientation as shown in FIG. 5 according to the sensing signals S1, so as to enhance the intensity of the airflow according to the heat source A20b.

Each of the heat sources A20b, A20c and A20d has a critical temperature. When the temperature of the heat sources A20b, A20c or A20d is close to, equal to or over the critical temperature, the processing device A70 will decrease the operation speed of the heat sources A20b, A20c or A20d, so as to decrease the temperature of the heat sources A20b, A20c or A20d.

In the embodiment, the processing device A70 can generate a priority value according to each of the temperatures of the heat sources A20b, A20c and A20d and the critical temperature. The priority value can be a difference value of one of the temperatures and the critical temperature.

When the heat source A20c has a greater priority value, it means the heat source A20c needs greater heat-dissipation efficiency. The processing device A70 can control the driving mechanism 40 to rotate the heat-dissipation structure 20 of the heat-dissipation device A30a to the first predetermined orientation as shown in FIG. 4 according to the priority value, so as to enhance the intensity of the airflow flowing to the heat source A20c.

When the heat source A20b has a greater priority value, it means the heat source A20b needs greater heat-dissipation efficiency. The processing device A70 controls the driving mechanism 40 to rotate the heat-dissipation structure 20 of the heat-dissipation device A30a to the second predetermined orientation as shown in FIG. 5 according to the priority value, so as to enhance the intensity of the airflow flowing to the heat source A20b.

Therefore, in the embodiment, by increasing the amount of the airflow flowing to the heat sources A20b (A20c or A20d), the heat-dissipation efficiency of the heat sources A20b (A20c or A20d) is improved, and the operation efficiency of the heat sources A20b (A20c or A20d) may not need to be decreased.

Figure 6:
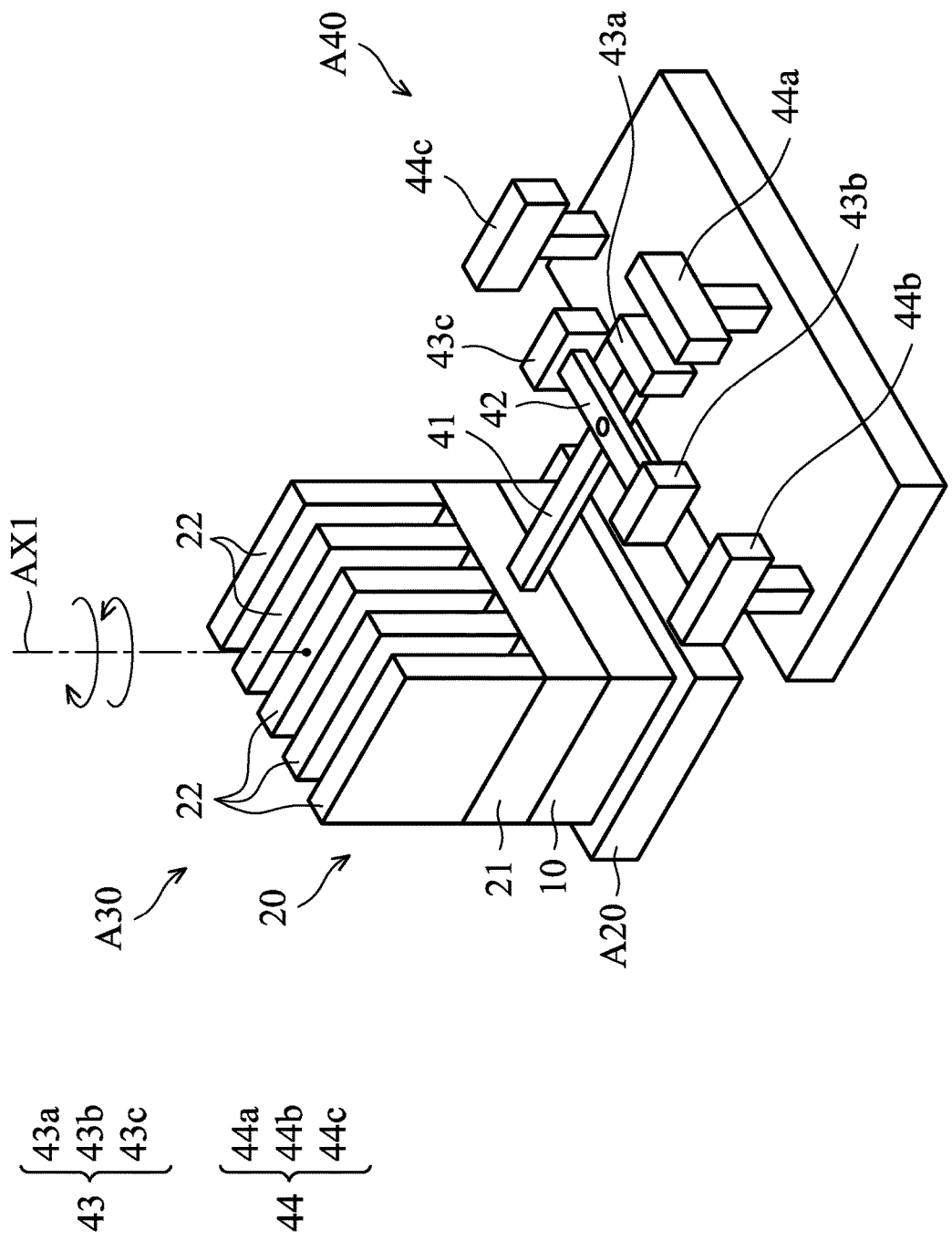
FIG. 6 is a perspective view of the heat-dissipation devices in accordance with the first embodiment of the disclosure.

FIG. 6 is a perspective view of the heat-dissipation devices A30 in accordance with the first embodiment of the disclosure. FIG. 7 is a cross-sectional view of the heat-dissipation devices A30 in accordance with the first embodiment of the disclosure. The bottom base 10 is detachably affixed to the heat source A20. In some embodiments, the bottom base 10 may not be located over the heat source A20, and the bottom base 10 is connected to the heat source A20 via a heat-dissipation element (not shown in figures) connected to the heat source A20. For example, the heat-dissipation element may be a heat pipe. The bottom base 10 is made from thermal material, such as metal.

The heat-dissipation structure 20 may be made from thermal material, such as metal. The heat-dissipation structure 20 includes a heat-dissipation base 21 and heat-dissipation fins 22. The heat-dissipation base 21 is rotatably disposed on the bottom base 10, and the heat-dissipation fin 22 is disposed on heat-dissipation base 21. In some embodiments, the heat-dissipation base 21 and the heat-dissipation fins 22 are formed as a single piece.

The pivot structure 30 is connected to the bottom base 10 and the heat-dissipation base 21. The heat-dissipation structure 20 is rotated relative to the bottom base 10 via the pivot structure 30. The pivot structure 30 includes a rotation shaft 31 and a rotation ball 32. The rotation shaft 31 is connected to the bottom base 10, and extends along an axis AX1. Therefore, the heat-dissipation structure 20 is rotated about the axis AX1 relative to the bottom base 10. The rotation ball 32 is disposed on the end of the rotation shaft 31, and in contact with the heat-dissipation base 21, so as to enhance the smoothness of the heat-dissipation base 21 rotated relative to the bottom base 10.

The driving mechanisms 40 are configured to selectively rotate the heat-dissipation structures 20 to various predetermined orientations. Each of the driving mechanism 40 includes a first connection element 41, a second connection element 42, magnetic elements 43 (such as magnetic elements 43a, 43b and 43c) and electromagnets 44 (such as electromagnets 44a, 44b and 44c). The first connection element 41 is connected to the heat-dissipation structure 20. In the embodiment, the first connection element 41 is a rod-shaped structure. One end of the first connection element 41 is connected to a side of the heat-dissipation base 21, and the other end is connected to the magnetic element 43a.

The second connection element 42 is pivoted on the first connection element 41. In the embodiment, the second connection element 42 may be a rod-shaped structure. Two ends of the second connection element 42 are connected to the magnetic element 43b and the magnetic element 43c.

The magnetic elements 43 (such as the magnetic elements 43a, 43b and 43c) are permanent magnets. The electromagnets 44 (such as the electromagnets 44a, 44b and 44c) are electrically connected to the processing device A70, and configured to the magnetic field. Moreover, the electromagnet 44a is adjacent to the magnetic element 43a, the electromagnet 44b is adjacent to the magnetic element 43b, and the electromagnet 44c is adjacent to the magnetic element 43c.

The processing device A70 changes the intensity of the magnetic field by adjusting the current transmitted to the electromagnets 44. Moreover, the heat-dissipation structure 20 is rotated to a predetermined orientation by changing the intensity of the magnetic field, and maintained on the predetermined orientation.

As shown in FIG. 6, the processing device A70 controls the intensity of the magnetic field of the electromagnet 44a to greater than the intensity of the magnetic field of the electromagnet 44b and the electromagnet 44c, so as to make the magnetic element 43a move close to the electromagnet 44a. As a result, the heat-dissipation structure 20 is rotated to a first predetermined orientation.

Figure 8A:
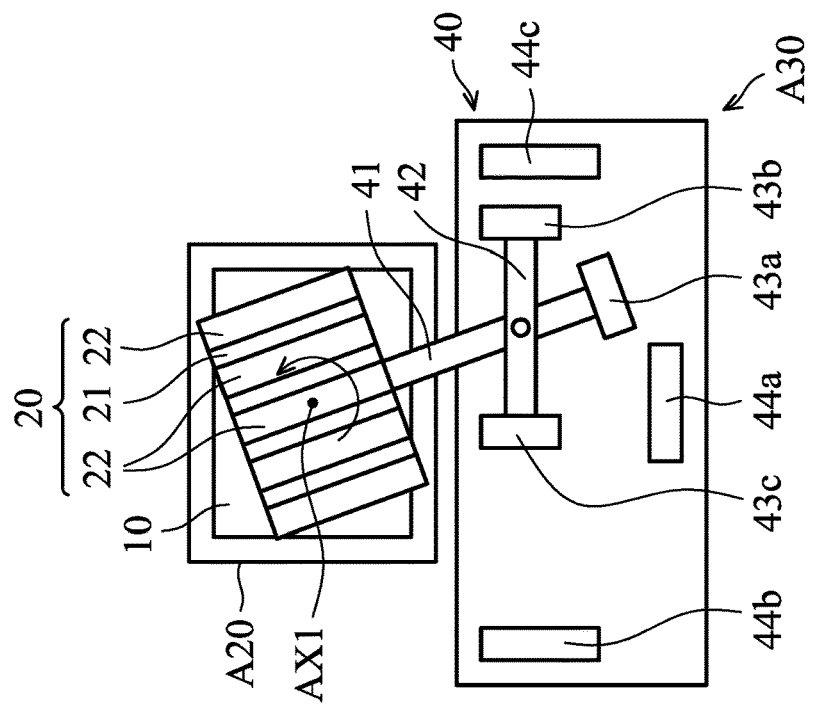
FIG. 8A and FIG. 8B are top views of the heat-dissipation devices in accordance with the first embodiment of the disclosure.
Figure 8B:
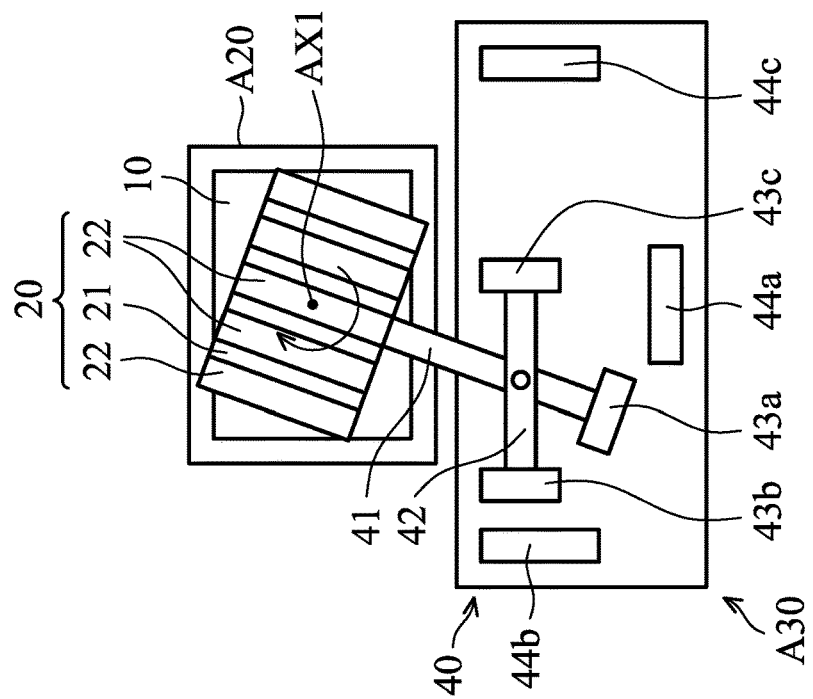

FIG. 8A and FIG. 8B are top views of the heat-dissipation devices A30 in accordance with the first embodiment of the disclosure. As shown in FIG. 8A, the processing device A70 controls the intensity of the magnetic field of the electromagnet 44b to greater than the intensity of the magnetic field of the electromagnet 44c (and the electromagnet 44a), so as to make the magnetic element 43b move close to the electromagnet 44b. As a result, the heat-dissipation structure 20 is rotated to a second predetermined orientation. As shown in FIG. 8B, the processing device A70 controls the intensity of the magnetic field of the electromagnet 44c to greater than the intensity of the magnetic field of the electromagnet 44b (and the electromagnet 44a), so as to make the magnetic element 43c move close to the electromagnet 44c. As a result, the heat-dissipation structure 20 is rotated to a third predetermined orientation.

Accordingly, in the embodiment, by adjusting the intensity of the magnetic field, the heat-dissipation structure 20 can be rotated to various predetermined orientations, but it is not limited to the predetermined orientations as shown in FIGS. 6, 8A and 8B.

Figure 9:
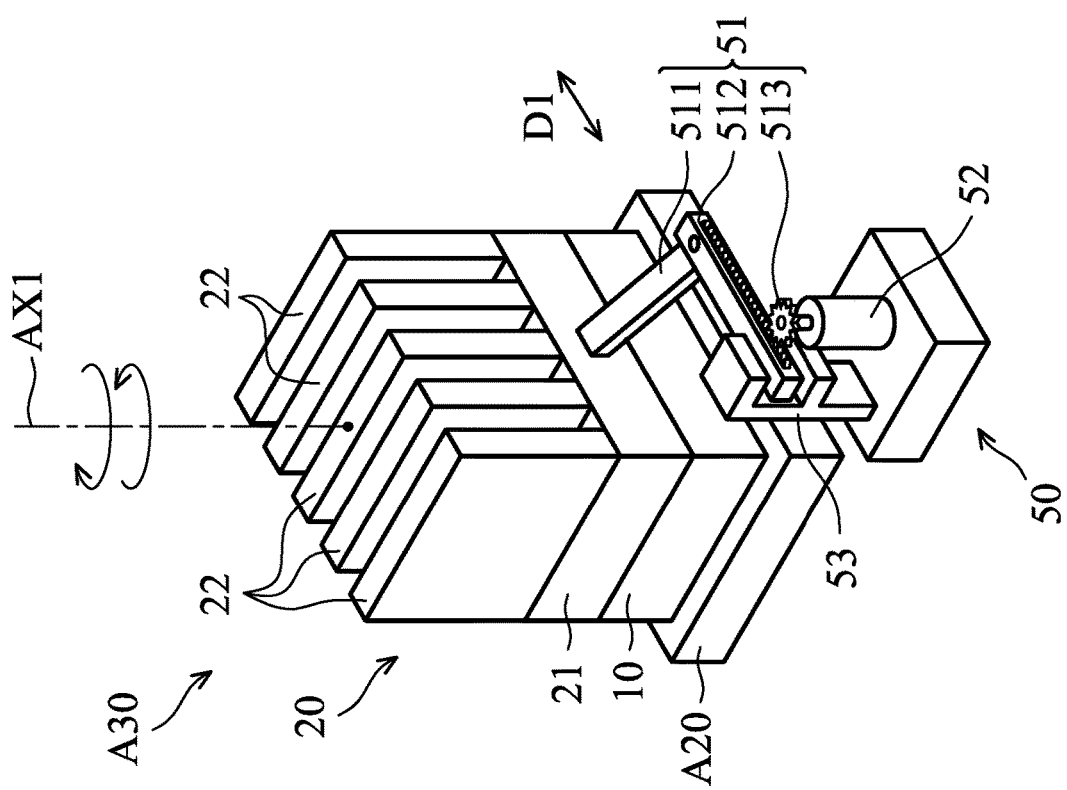
FIG. 9 is a perspective view of a heat-dissipation device in accordance with a second embodiment of the disclosure.

FIG. 9 is a perspective view of a heat-dissipation device A30 in accordance with a second embodiment of the disclosure. In the embodiment, the heat-dissipation device A30 includes a driving mechanism 50. The driving mechanism 50 includes a connection assembly 51 and a motor 52. The connection assembly 51 is connected to the heat-dissipation structure 20 and the motor 52. The motor 52 is configured to drive the connection assembly 51 to make the connection assembly 51 rotate the heat-dissipation structure 20 to a predetermined orientation, and to maintain the heat-dissipation structure 20 at the predetermined orientation.

The connection assembly 51 includes a connection element 511, a rack 512, and a gear 513. The connection element 511 is disposed on the heat-dissipation structure 20. In the embodiment, the connection element 511 may be a rod-shaped structure, and connected to a side of the heat-dissipation base 21. The rack 512 is pivoted on the connection element 511. The gear 513 is engaged with the rack 512, and connected to the motor 52. In the embodiment, the connection assembly 51 may further includes a retaining structure 53 configured to retain the movement of the rack 512 along a movement direction D1.

Figure 10B:
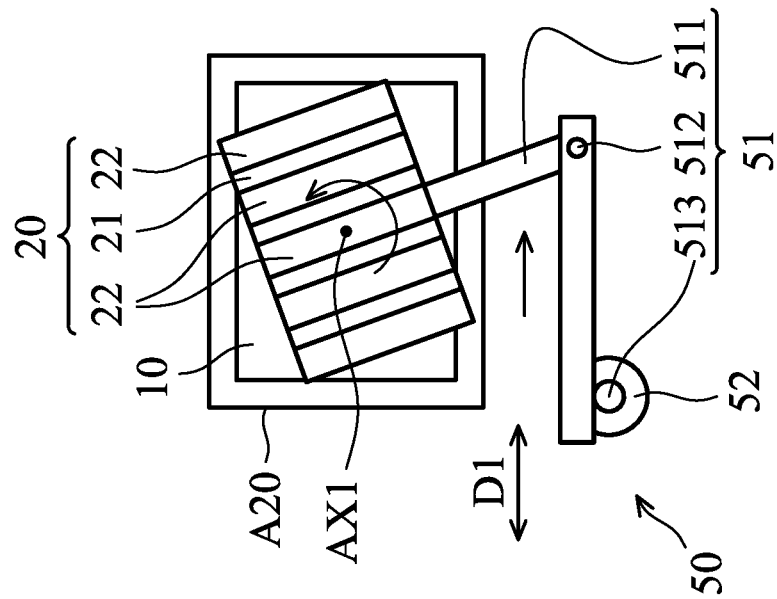
FIG. 10A and FIG. 10B are top views of the heat-dissipation device in accordance with the second embodiment of the disclosure.
Figure 10A:
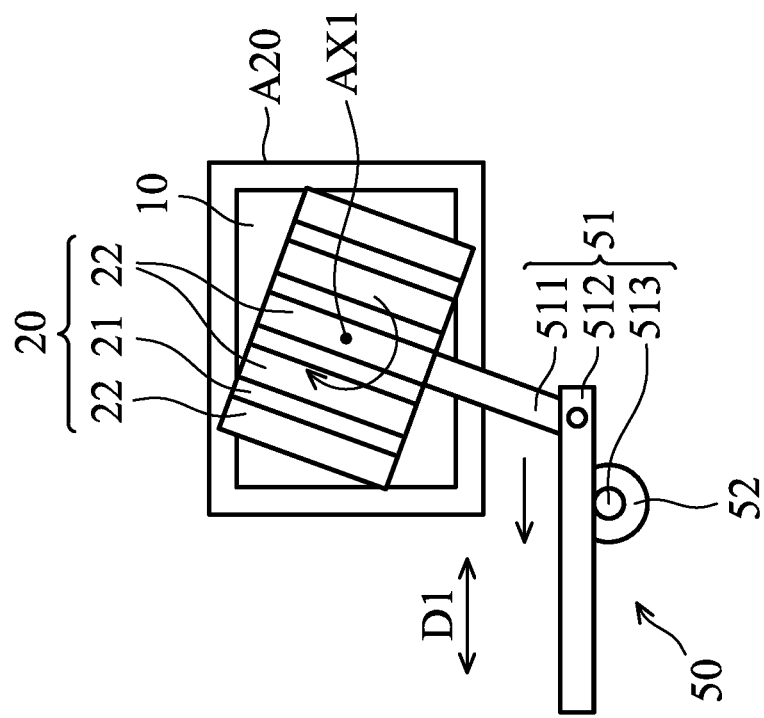

As shown in FIG. 9, the processing device A70 drives the motor 52 to move the rack 512 along the movement direction D1, so as to rotate the heat-dissipation structure 20 to a first predetermined orientation. FIG. 10A and FIG. 10B are top views of the heat-dissipation device A30 in accordance with the second embodiment of the disclosure. As shown in FIG. 10A, the processing device A70 drives the motor 52 to move the rack 512 along the movement direction D1, so as to rotate the heat-dissipation structure 20 to a second predetermined orientation. As shown in FIG. 10B, the processing device A70 drives the motor 52 to move the rack 512 along the movement direction D1, so as to rotate the heat-dissipation structure 20 to a third predetermined orientation.

Accordingly, in the embodiment, the heat-dissipation structure 20 can be rotated to various predetermined orientations by driving the motor 52, but it is not limited to the predetermined orientations as shown in FIGS. 9, 10A and 10B.

The disclosed features may be combined, modified, or replaced in any suitable manner in one or more disclosed embodiments, but are not limited to any particular embodiments.

In conclusion, the electronic device of the disclosure improves the heat-dissipation efficiency of the heat-dissipation device by adjusting the orientation of the heat-dissipation structure. In some embodiments, when at least one of the fans is not working, the heat-dissipation system can provide good heat-dissipation efficiency, so as to prevent the electronic device from overheating and crashing. In some embodiments, the heat-dissipation system selectively increases the amount of the airflow flowing to some of the heat sources, so as to prevent from decreasing the efficiency of some of heat sources due to overheating.

While the invention has been described by way of example and in terms of preferred embodiment, it should be understood that the invention is not limited thereto. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A heat-dissipation device configured to be disposed in an electronic apparatus, wherein the heat-dissipation device comprises:
    a bottom base;
    a heat-dissipation structure comprising:
        a heat-dissipation base rotatably disposed on the bottom base; and
        a plurality of heat-dissipation fins disposed on the heat-dissipation base; and
    a driving mechanism configured to selectively rotate the heat-dissipation structure to one of a plurality of predetermined orientations,
    wherein the driving mechanism comprises:
        a first connection element connected to the heat-dissipation structure;
        a first magnetic element disposed on the first connection element;
        a first electromagnet adjacent to the first magnetic element, and configured to generate a first magnetic field;
        a second connection element pivoted on the first connection element;
        a second magnetic element disposed on the second connection element; and
        a second electromagnet adjacent to the second magnetic element, and configured to generate a second magnetic field,
    wherein the heat-dissipation structure is rotated to one of the predetermined orientations by changing strengths of the first magnetic field and the second magnetic field.

2. An electronic apparatus with a heat-dissipation system, comprising:
    a housing;
    a heat-dissipation device comprising:
        a bottom base located in the housing;
        a heat-dissipation structure rotatably disposed on the bottom base; and
        a driving mechanism configured to rotate the heat-dissipation structure;
    a fan disposed in the housing, and configured to generate an airflow passing through the heat-dissipation structure;
    a plurality of sensors disposed in the housing, and configured to generate a plurality of sensing signals; and
    a processing device selectively rotating the heat-dissipation structure to one of the predetermined orientations according to the sensing signals, so as to enhance the intensity of the airflow passing through the heat-dissipation structure,
    wherein the driving mechanism comprises:
        a first connection element connected to the heat-dissipation structure;
        a first magnetic element disposed on the first connection element;
        a first electromagnet adjacent to the first magnetic element, and configured to generate a first magnetic field;
        a second connection element pivoted on the first connection element;
        a second magnetic element disposed on the second connection element; and
        a second electromagnet adjacent to the second magnetic element, and configured to generate a second magnetic field,
    wherein the heat-dissipation structure is rotated to one of the predetermined orientations by changing strengths of the first magnetic field and the second magnetic field.

3. The electronic apparatus as claimed in claim 2, wherein at least one of the sensors is located between the heat-dissipation structure and the fan.

4. The electronic apparatus as claimed in claim 2, wherein the heat-dissipation structure is located between the fan and the sensors.

5. The electronic apparatus as claimed in claim 4, further comprising a plurality of heat sources disposed in the housing, wherein the sensors are located between the heat sources and the heat-dissipation structure, and adjacent to the heat sources or integrated in the heat sources,
    wherein the processing device is configured to selectively rotate the heat-dissipation structure to one of the predetermined orientations according to the sensing signals, so as to enhance the intensity of the airflow toward to one of the heat sources.

6. An electronic apparatus with a heat-dissipation system, comprising:
    a housing;
    a heat-dissipation device comprising:
        a bottom base located in the housing;
        a heat-dissipation structure rotatably disposed on the bottom base; and
        a driving mechanism configured to rotate the heat-dissipation structure;
    a plurality of fans disposed in the housing, and configured to generate an airflow passing through the heat-dissipation structure; and
    a processing device configured to detect an operation condition of the fans, and generating an operation signal,
    wherein the processing device controls the driving mechanism to make the heat-dissipation structure rotate to a predetermined orientation according to the operation signal,
    wherein the driving mechanism comprises:
        a first connection element connected to the heat-dissipation structure;
        a first magnetic element disposed on the first connection element;

a first electromagnet adjacent to the first magnetic element, and configured to generate a first magnetic field;

a second connection element pivoted on the first connection element;

a second magnetic element disposed on the second connection element; and a second electromagnet adjacent to the second magnetic element, and configured to generate a second magnetic field, wherein the heat-dissipation structure is rotated to one of the predetermined orientations by changing strengths of the first magnetic field and the second magnetic field.

\* \* \* \* \*